(12) United States Patent
Sugiyama et al.

(10) Patent No.: US 11,680,989 B2
(45) Date of Patent: Jun. 20, 2023

(54) DIAGNOSIS METHOD OF BATTERY, DIAGNOSIS DEVICE OF BATTERY, DIAGNOSIS SYSTEM OF BATTERY, BATTERY-MOUNTED DEVICE, AND NON-TRANSITORY STORAGE MEDIUM

(71) Applicant: KABUSHIKI KAISHA TOSHIBA, Tokyo (JP)

(72) Inventors: Nobukatsu Sugiyama, Kawasaki Kanagawa (JP); Yumi Fujita, Tokyo (JP); Tomokazu Morita, Funabashi Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/446,397

(22) Filed: Aug. 30, 2021

(65) Prior Publication Data
US 2022/0299574 A1 Sep. 22, 2022

(30) Foreign Application Priority Data
Mar. 12, 2021 (JP) .............................. JP2021-040093

(51) Int. Cl.
*G01R 31/3842* (2019.01)
*H01M 10/42* (2006.01)
*G01R 31/392* (2019.01)
*H02J 7/00* (2006.01)
*H01M 10/48* (2006.01)
*G01R 31/367* (2019.01)

(52) U.S. Cl.
CPC ....... *G01R 31/3842* (2019.01); *G01R 31/367* (2019.01); *G01R 31/392* (2019.01); *H01M 10/4285* (2013.01); *H01M 10/488* (2013.01); *H02J 7/0048* (2020.01)

(58) Field of Classification Search
CPC .............. G01R 31/3842; G01R 31/392; G01R 31/367; H02J 7/0048; H01M 10/4285
USPC ............. 324/415, 437, 425–435, 76.11, 126, 324/756.05, 538, 200, 530, 207.13, 233, 324/256, 515, 500–750.6
See application file for complete search history.

(56) References Cited

U.S. PATENT DOCUMENTS

| 10,191,116 B2 | 1/2019 | Aliyev et al. |
| 10,871,522 B2 | 12/2020 | Ishii et al. |
| 2013/0027047 A1* | 1/2013 | Yoshioka ............. G01R 31/389 324/426 |
| 2020/0408846 A1 | 12/2020 | Bae et al. |

FOREIGN PATENT DOCUMENTS

| EP | 2 530 482 A2 | 12/2012 |
| JP | 2012-251806 A | 12/2012 |
| JP | 2014-193040 A | 10/2014 |
| JP | 2015-111086 A | 6/2015 |

(Continued)

*Primary Examiner* — Lee E Rodak
*Assistant Examiner* — Trung Q Nguyen
(74) *Attorney, Agent, or Firm* — Finnegan, Henderson, Farabow, Garrett & Dunner, LLP (57) ABSTRACT

According to an embodiment, a diagnosis method of a battery is provided. In the diagnosis method, based on an internal state of the battery at a plurality of mutually different times, a time when the internal state of the battery becomes a predetermined state after the plurality of mutually different times is estimated.

11 Claims, 6 Drawing Sheets

(56) References Cited

FOREIGN PATENT DOCUMENTS

| | | | |
|---|---|---|---|
| JP | 2018-530982 | A | 10/2018 |
| JP | 2018-185209 | A | 11/2018 |
| JP | 6531836 | B2 | 6/2019 |
| JP | 2020-532267 | A | 11/2020 |
| JP | 2022-133614 | A | 9/2022 |
| WO | WO2017/098686 | A1 | 6/2017 |

* cited by examiner

DIAGNOSIS METHOD OF BATTERY, DIAGNOSIS DEVICE OF BATTERY, DIAGNOSIS SYSTEM OF BATTERY, BATTERY-MOUNTED DEVICE, AND NON-TRANSITORY STORAGE MEDIUM

CROSS-REFERENCE TO RELATED APPLICATIONS

This application is based upon and claims the benefit of priority from Japanese Patent Application No. 2021-040093, filed Mar. 12, 2021; the entire contents of which are incorporated herein by reference.

FIELD

Embodiments relate to a diagnosis method of a battery, a diagnosis device of a battery, a diagnosis system of a battery, a battery-mounted device, and a non-transitory storage medium.

BACKGROUND

With the popularization of information-related devices and communication devices, secondary batteries have been widely applied as electric power sources of devices. In addition, secondary batteries have been utilized in fields of electric vehicles (EV), natural energy, and the like. In particular, lithium ion secondary batteries are widely used since the lithium ion secondary batteries have high energy density and can be reduced in size.

The secondary battery, such as a lithium ion secondary battery, deteriorates with the passing of time from the start of use, and also deteriorates by repetition of charge and discharge. Thus, it is important to ascertain the deterioration state of the battery such as the lithium ion secondary battery. Examples of the index, which is indicative of the deterioration state of a battery, include a battery capacitance of the battery, and examples of the method of predicting the deterioration state of the battery include predicting the battery capacitance of the battery, such as a full charge capacitance. In this case, for example, the battery capacitance is predicted by using such an empirical rule (square root law) that the amount of decrease of the battery capacitance of a battery is proportional to an elapsed time to the power of 0.5, from the time of the start of use of the battery. On the other hand, in the use of the battery, there is a case in which the rate of decrease of the battery capacitance does not agree with the empirical rule (square root law), and the battery capacitance sharply decreases with time. In the use of the battery, for example, it is required to predict a time when the probability of a sharp decrease of the battery capacitance of the battery increases, before the probability of a sharp decrease of the battery capacitance of the battery increases.

DETAILED DESCRIPTION

According to an embodiment, a diagnosis method of a battery is provided. In the diagnosis method, based on an internal state of the battery at a plurality of mutually different times, a time when the internal state of the battery becomes a predetermined state after the plurality of mutually different times is estimated.

Hereinafter, embodiments will be described with reference to the accompanying drawings.

First Embodiment

Figure 1:
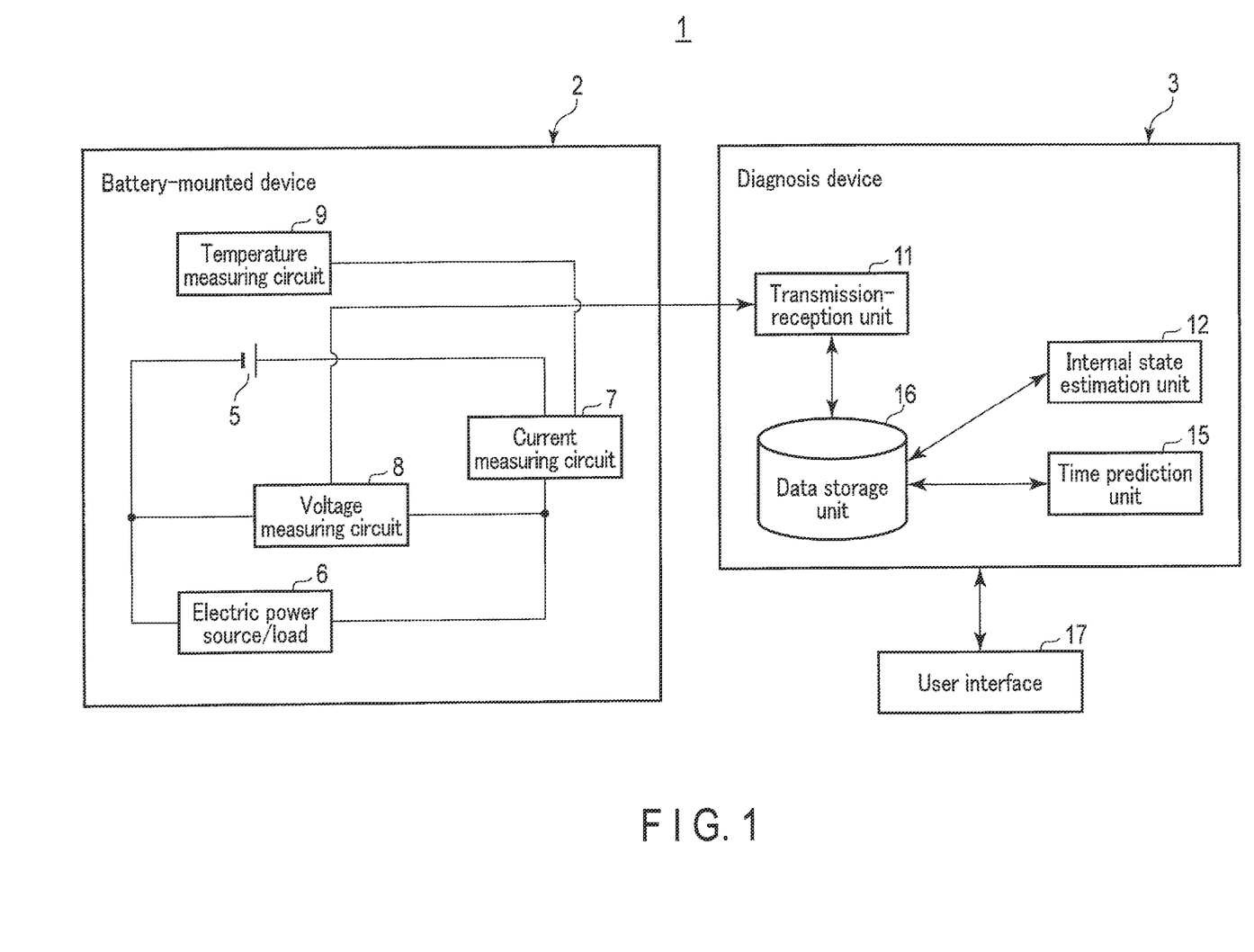
FIG. 1 is a schematic view illustrating a diagnosis system of a battery according to a first embodiment.

To begin with, a first embodiment will be described as one example of embodiments. FIG. 1 illustrates a diagnosis system 1 of a battery 5 according to the first embodiment. As illustrated in FIG. 1, the diagnosis system 1 includes a battery-mounted device 2 and a diagnosis device 3. The battery 5 is mounted in the battery-mounted device 2. Examples of the battery-mounted device 2 include a large-sized electricity storage device for an electric power system, a smartphone, a vehicle, a household power source device, a stationary power source device, a robot, and a drone. Examples of the vehicle serving as the battery-mounted device 2 include a railway vehicle, an electric bus, an electric automobile, a plug-in hybrid automobile, and an electric bicycle.

The battery 5 is, for example, a secondary battery such as a lithium ion secondary battery. The battery 5 may be formed of a unit cell (unit battery), or may be a battery module or a cell block formed by electrically connecting a plurality of unit cells. When the battery 5 is formed of a plurality of unit cells, the unit cells may be electrically connected in series, or may be electrically connected in parallel, in the battery 5. In addition, in the battery 5, both of a series-connection structure in which unit cells are connected in series, and a parallel-connection structure in which unit cells are connected in parallel, may be formed. Furthermore, the battery 5 may be any one of a battery string, a battery array and a storage battery, in each of which a plurality of battery modules are electrically connected.

In the diagnosis system 1, an electric power source and a load (indicated by reference sign 6) are provided. The electric power supply can supply electric power to the battery 5, and the battery 5 is charged by being supplied with electric power from the electric power source or the like. Electric power can be supplied to the load from the battery 5, and the battery 5 discharges by supplying electric power to the load or the like. Examples of the electric power source include a battery different from the battery 5, and a generator. Examples of the load include an electric motor and a light. In one example, an electricity storage, to which electric power is supplied from the battery 5, may be provided in place of the load or in addition to the load. In this case, the battery 5 discharges by supplying electric power to the electricity storage. In addition, the electricity storage can store electric power supplied from the battery 5. In another example, a motor generator may be provided. In this case, electric power can be supplied to the motor generator from the battery 5, and electric power can be supplied to the battery 5 from the motor generator. Specifically, the motor generator functions as both the electric power source and the load. Note that in FIG. 1, the electric power source and the load are mounted in the battery-mounted device 2, but the embodiment is not limited to this. The battery 5 may supply electric power to a load on the outside of the battery-mounted device 2, or the battery 5 may be supplied with electric power from an electric power source on the outside of the battery-mounted device 2.

In addition, in the diagnosis system 1, a current measuring circuit 7 and a voltage measuring circuit 8 are provided. The current measuring circuit 7 and voltage measuring circuit 8 constitute measuring circuitry which measures parameters relating to the battery 5. The current measuring circuit 7 measures an electric current flowing in the battery 5 in the charge and discharge, or the like, of the battery 5. The voltage measuring circuit 8 measures a voltage of the battery 5 in the charge and discharge, or the like, of the battery 5. In the charge or discharge, or the like, of the battery 5, the current measuring circuit 7 measures electric current at each of a plurality of measuring time points, and the voltage measuring circuit 8 measures voltage at each of a plurality of measuring time points. Note that in the example of FIG. 1, the measuring circuitry, such as the current measuring circuit 7 and voltage measuring circuit 8, is mounted in the battery-mounted device 2, but the measuring circuitry may be provided outside the battery-mounted device 2. Besides, in one example, similarly with the example of FIG. 1, or the like, the measuring circuitry may include a temperature measuring circuit. In this case, in the charge and discharge, or the like, of the battery 5, the measuring circuitry measures the temperature of the battery 5, in addition to the electric current and voltage of the battery 5. The temperature of the battery 5, too, is measured at each of a plurality of measuring time points.

The diagnosis device 3 performs diagnosis relating to the battery 5, such as by determining the deterioration state of the battery 5. Thus, the battery 5 serves as a diagnosis target by the diagnosis device 3. In the example of FIG. 1, or the like, the diagnosis device 3 is provided outside the battery-mounted device 2. The diagnosis device includes a transmission-reception unit 11, an internal state estimation unit 12, a time prediction unit 15, and a data storage unit 16. The diagnosis device 3 is, for example, a server which can communicate with the battery-mounted device 2 (a processing device mounted in the battery-mounted device 2) via a network. In this case, the diagnosis device includes a processor and a non-transitory storage medium.

The processor includes any one of a CPU (Central Processing Unit), an ASIC (Application Specific Integrated Circuit), a microcomputer, an FPGA (Field Programmable Gate Array), a DSP (Digital Signal Processor), and the like. The non-transitory storage medium may include an auxiliary storage device, in addition to a main storage device such as a memory. Examples of the non-transitory storage medium include a magnetic disk, an optical disc (e.g. CD-ROM, CD-R, DVD), a magneto-optical disc (e.g. MO), and a semiconductor memory. In the diagnosis device 3, each of the number of processors and the number of non-transitory storage media may be one or plural. In the diagnosis device 3, the processor executes a program or the like stored in the non-transitory storage medium or the like, thereby executing a process. In addition, the program that is executed by the processor of the diagnosis device 3 may be stored in a computer (server) connected to the diagnosis device 3 via a network such as the Internet, or may be stored in a server or the like in a cloud environment. In this case, the processor downloads the program via the network. In the diagnosis device 3, the transmission-reception unit 11, internal state estimation unit 12 and time prediction unit 15 execute parts of processes which are executed by the processor or the like, and the non-transitory storage medium functions as the data storage unit 16.

Note that, in one example, the diagnosis device 3 may be a cloud server which is constructed in a cloud environment. The infrastructure of the cloud environment is constituted by a virtual processor such as a virtual CPU, and a cloud memory. Thus, when the diagnosis device 3 is the cloud server, parts of processes executed by the virtual processor are executed by the transmission-reception unit 11, internal state estimation unit 12 and time prediction unit 15. In addition, the cloud memory functions as the data storage unit 16.

Furthermore, the data storage unit 16 may be provided in a computer which is separate from the battery-mounted device 2 and diagnosis device 3. In this case, the diagnosis device 3 is connected via a network to the computer in which the data storage unit 16 or the like is provided. In addition, the diagnosis device 3 may be mounted in the battery-mounted device 2. In this case, the diagnosis device 3 is constituted by a processing device or the like, which is mounted in the battery-mounted device 2. Besides, when the diagnosis device 3 is mounted in the battery-mounted device 2, one processing device or the like, which mounted in the battery-mounted device 2, may execute a process (to be described later) of the diagnosis device 3, and may execute control or the like of the charge and discharge of the battery 5.

In one example, like the example of FIG. 1, or the like, the diagnosis system 1 may include a user interface 17. In this case, the user interface 17 includes an operation unit to which an opera tonal instruction is input by the user or the like of the battery-mounted device 2, and a notification unit which notifies the user or the like of the battery-mounted device 2 of information including alert information. The notification unit notifies information, for example, by either screen display or voice, or the like. Hereinafter, a process of the diagnosis device 3 will be described.

The processor or the like of the diagnosis device 3 periodically estimates the internal state of the battery 5, as diagnosis of the battery 5 that is a target of diagnosis. The transmission-reception unit 11 communicates with the processing device other than the diagnosis device 3, such as the processing device of the battery-mounted device 2, via the network. When the internal state of the battery 5 is estimated by the diagnosis device 3, the transmission-reception unit 11 of the diagnosis device 3 transmits a control instruction to the processing device or the like of the battery-mounted device 2, and the processing device or the like of the battery-mounted device 2 charges or discharges the battery 5 under a predetermined condition, based on the transmitted control instruction.

The measuring circuitry including the current measuring circuit 7 and voltage measuring circuit 8 measures the above-described parameters relating to the battery 5, in the state in which the battery 5 is being charged or discharged, for example, under a predetermined condition. In addition, the transmission-reception unit 11 receives, for example, the measurement data including the measurement result in the measuring circuitry of the parameters relating to the battery 5, from the battery-mounted device 2. The measurement data include a measurement result in the current measuring circuit 7 of the electric current flowing in the battery 5, and a measurement result in the voltage measuring circuit 8 of the voltage of the battery 5, and may also include a measurement result in the temperature measuring circuit 9 of the temperature of the battery 5, for example. The measurement data include measurement values of the parameters relating to the battery 5 at each of a plurality of measuring time points (a plurality of times of measurement). In addition, the measurement data include time variations (time histories) of the parameters relating to the battery 5 while the battery 5 is being charged or discharged under the predetermined condition. Accordingly, the measurement data include a time variation (time history) of the electric current of the battery 5, a time variation (time history) of the voltage of the battery 5, and a time variation (time history) of the temperature of the battery 5, for example.

Furthermore, at least one of the processing device of the battery-mounted device 2 and the processor of the diagnosis device 3 may estimate a charge amount of the battery 5, based on the measurement result of the parameters relating to the battery 5, for example. In this case, the transmission-reception unit 11 or the like of the diagnosis device 3 may acquire, as data included in the above-described measurement data, an estimation value of the charge amount of the battery 5, and the time variation (time history) of the estimation value of the charge amount of the battery 5. In addition, the Measurement data may include data indicative of a relation of the above-described measured parameters relating to the battery 5 to the estimated charge amount of the battery 5. In this case, for example, the data indicative of the relation of the measured voltage of the battery 5 to the estimated charge amount of the battery 5 is included in the measurement data.

A real-time charge amount of the battery 5 can be calculated based on the charge amount of the battery 5 at a time of, for example, the start of charge or discharge under the predetermined condition, and the time variation of the electric current of the battery 5 in the charge or discharge under the predetermined condition. In this case, based on the time variation of the electric current, an integration value of the electric current of the battery 5 from the start time of charge or discharge is calculated. Further, the charge amount of the battery 5 is calculated based on the charge amount of the battery at the time of, for example, the start of charge or discharge, and the calculated integration value. The transmission-reception unit 11 stores the received measurement data or the like into the data storage unit 16.

The internal state estimation unit 12 acquires the above-described measurement data, and estimates, based on the measurement data, the internal state of the battery 5 during the period in which the battery 5 is charged or discharged under the predetermined condition. In the present embodiment, the internal state estimation unit 12 estimates internal state parameters indicative of the internal state of the battery 5. In one example, the internal state estimation unit 12 estimates the internal state of the battery 5 by analyzing the data indicative of the time variation of at least one of the current and the voltage of the battery 5 in the charge or discharge under the above-described predetermined condition, i.e. by executing charge curve analysis or discharge curve analysis in regard to the battery 5.

Here, in the battery 5, a lower-limit electric potential and an upper-limit electric potential are defined for a positive electrode electric potential, and the positive electrode electric potential varies between the lower-limit electric potential and the upper-limit electric potential in accordance with the variation of the charge amount of the positive electrode. The positive electrode electric potential increases as the charge amount of the positive electrode becomes greater. In addition, the charge amount of the positive electrode in the state in which the positive electrode electric potential becomes the lower-limit electric potential is defined as an initial charge amount of the positive electrode, and the charge amount of the positive electrode in the state in which the positive electrode electric potential becomes the upper-limit electric potential is defined as an upper-limit charge amount of the positive electrode. In addition, in the battery 5, a charge amount from the initial charge amount of the positive electrode to the upper-limit charge mount of the positive electrode is a positive electrode capacitance which is equivalent to a chargeable/dischargeable amount of the positive electrode. The positive electrode capacitance may be indicated by a unit such as (mA·h), or may be indicated by a ratio to the capacitance at the time of the start of use of the battery 5, i.e. a positive electrode capacity retention ratio.

Like the positive electrode, in the battery 5, a lower-limit electric potential and an upper-limit electric potential are defined for a negative electrode electric potential, and the negative electrode electric potential varies between the lower-limit electric potential and the upper-limit electric potential in accordance with the variation of the charge amount of the negative electrode. The negative electrode electric potential decreases as the charge amount of the negative electrode becomes greater. In addition, the charge amount of the negative electrode in the state in which the negative electrode electric potential becomes the upper-limit electric potential is defined as an initial charge amount of the negative electrode, and the charge amount of the negative electrode in the state in which the negative electrode electric potential becomes the lower-limit electric potential is defined as an upper-limit charge amount of the negative electrode. In addition, in the battery 5, a charge amount from the initial charge amount of the negative electrode to the upper-limit charge amount of the negative electrode is a negative electrode capacitance which is equivalent to a chargeable/dischargeable amount of the negative electrode. The negative electrode capacitance may be indicated by a unit such as (mA·h), or may be indicated by a ratio to the capacitance at the time of the start of use of the battery 5, i.e. a negative electrode capacity retention ratio.

The internal state parameters of the battery 5 include the above-described positive electrode capacitance, negative electrode capacitance, initial charge amount of the positive electrode, and initial charge amount of the negative electrode. In addition, the internal state parameters of the battery 5 include a positive electrode mass which is a parameter corresponding to the positive electrode capacitance, and a negative electrode mass which is a parameter corresponding to the negative electrode capacitance. The positive electrode mass can calculated based on the positive electrode capacitance and the kind of material, of which the positive electrode is formed. Similarly, the negative electrode mass can be calculated based on the negative electrode capacitance and the kind of material, of which the negative electrode is formed. Furthermore, the internal state parameters of the battery 5 include an SOW (Shift of Operation Window) which is a shift between the initial charge amount of the positive electrode and the initial charge amount of the negative electrode. Besides, the internal state parameters of the battery 5 include a parameter relating to the internal resistance of the battery 5, a parameter relating to the resistance of the positive electrode, and a parameter relating to the resistance of the negative electrode.

The data storage unit 16 stores data indicative of a relation of the internal state of the battery 5 to at least one of the voltage and the electric current of the battery 5, and stores, for example, a calculation formula for calculating at least one of the electric current and the voltage of the battery 5 from one or more of the above-described internal state parameters. Note that the relation of the internal state of the battery 5 to each of the voltage and the electric current of the battery 5 varies in accordance with the temperature of the battery 5, or the like. Thus, the data storage unit 16 may store data in which the relation of the internal state of the battery 5 to at least one of the voltage and the electric current of the battery 5 is set in regard to a plurality of mutually different temperatures.

When the internal state of the battery 5 is estimated by the above-described charge curve analysis or discharge curve analysis of the battery 5, the internal state estimation unit 12 performs a fitting calculation (regression calculation) by using a measurement result relating to at least one of the voltage and electric current of the battery 5 included in the measurement data, and the data indicative of the relation of the internal state of the battery 5 to at least one of the voltage and electric current of the battery 5. At this time, the fitting calculation is performed by setting one or more of the internal state parameters as a variable or variables in the calculation formula for calculating at least one of the electric current and the voltage of the battery 5 from one or more of the internal state parameters of the battery 5. In addition, the internal state estimation unit 12 estimates the internal state of the battery 5 by calculating, by the fitting calculation, the one or more of the internal state parameters which become variables. Thereby, the internal state of the battery 5 in the period in which the battery 5 is charged or discharged under the predetermined condition is estimated. The internal state estimation unit 12 stores the estimation result of the internal state of the battery 5, including the estimation value of the internal state parameter of the battery 5, into the data storage unit 16 as estimation data.

Note that a method of estimating the internal state of a battery by charge curve analysis is disclosed in reference document 1 (Jpn. Pat. Apln. KOKAI Publication No. 2012-251806). In reference document 1, too, the internal state of the battery is estimated by performing the fitting calculation by using the measurement result relating to at least one of the voltage and electric current of the battery, and the data indicative of the relation of the internal state of the battery to at least one of the voltage and electric current of the battery. In the present embodiment, the internal state of the battery 5 may be estimated like reference document 1.

In the estimation of the internal state of the battery 5, the internal state estimation unit 12 reads, from the data storage unit 16, the data indicative of the relation of the internal state of the battery 5 to at least one of the voltage and electric current of the battery 5, including the calculation formula for calculating at least one of the electric current and the voltage of the battery 5 from one or more of the internal state parameters. In addition, in the above-described estimation of the internal state, there is a case in which a provisional estimation value or the like relating to the internal state parameter is calculated in a process of obtaining a final estimation result. In this case, the internal state estimation unit 12 may estimate the internal state of the battery 5 by using the provisional estimation value relating to the internal state parameter. In addition, the internal state estimation unit 12 can store, in the data storage unit 16, estimation values which will be needed in a subsequent process, among the provisional estimation values and final estimation values relating to the internal state parameter.

In the present embodiment, the processor or the like of the diagnosis device 3 periodically executes the above-described estimation of the internal state of the battery 5. Thus, the battery 5 is charged or discharged under a predetermined condition at a plurality of mutually different times, and the internal state of the battery is estimated in regard to a plurality of mutually different times. Specifically, estimation data indicative of the estimation result of the internal state of the battery 5 is generated in regard to each of mutually different times. Accordingly, a plurality of estimation data are generated by periodically estimating the internal state of the battery at the plurality of times. In each of the estimation data, the estimated internal state is correlated with a time. Specifically, in each of the estimation data stored in the data storage unit 16, the estimated internal state is correlated with the time of estimation at which the internal state was estimated.

In the description below, it is assumed that when the estimation of the internal state of the battery 5 is executed an m-number of times; and an m-number of estimation data are generated, the estimation data are referred to as estimation data $D_0, D_1, \ldots, D_{m-1}$, in the order from the earliest time of estimation. Here, m indicates a data number of the generated estimation data, and is an integer of 1 or more. The data number m corresponds to a data number of the estimation data stored in the data storage unit 16, and corresponds to the number of times of estimation of the internal state of the battery 5. The data number m is incremented by 1, each time the estimation of the internal state of the battery 5 is executed by the internal state estimation unit 12, i.e. each time the estimation data is generated.

In addition, in the battery 5, a battery capacitance is defined as a parameter indicative of a battery characteristic. The battery capacitance is equivalent to a chargeable/dischargeable amount of the battery 5, and is indicated by, for example, a full charge capacitance. Further, the battery capacitance may be indicated by a unit such as (mA·h), or may be indicated by a ratio to the capacitance at the time of start of use of the battery 5, i.e. a battery capacity retention ratio. From the start of use of the battery 5 to the passage of a certain length of time, the battery capacitance of the battery 5 gradually decreases with time, and, for example, decreases according to such an empirical rule (square root law) that the amount of decrease of the battery capacitance of a battery is proportional to an elapsed time to the power of 0.5, from the time of start of use of the battery. However, after the passage of a certain length of time from the start of use of the battery 5, there is a case in which the battery capacitance sharply decreases with time. In this case, the rate of decrease of the battery capacitance does not agree with the empirical rule (square root law). In the use of the battery, for example, a sharp decrease of the battery capacitance greatly affects the charge and discharge, or the like, of the battery 5. Thus, it is important to predict in advance a time when the probability of a sharp decrease of the battery capacitance of the battery 5 increases.

The time prediction unit 15 predicts a time when the probability of a sharp decrease of the battery capacitance of the battery 5 increases. Specifically, the time when the probability of a sharp decrease of the battery capacitance of the battery 5 increases is predicted as a prediction result. At this time, the time prediction unit 15 predicts the above-described time by using the internal state of the battery 5 at a plurality of mutually different times. In addition, in the present embodiment, a necessary data number n is defined in the prediction by the time prediction unit 15. The necessary data number n is indicative of a data number of estimation data necessary for predicting the time when the probability of a sharp decrease of the battery capacitance of the battery increases, and is an integer of 2 or more. The time prediction unit 15 performs prediction by using an n-number of estimation data. In one example, the necessary data number is 3.

In the prediction of the above-described time, the time prediction unit 15 determines whether or not the data number m of the generated estimation data is the necessary data number n or more. Then, when the data number m is less than the necessary data number n, the time prediction unit 15 determines that the data is deficient for the prediction of the time, and does not perform the prediction of the time. At this time, the time prediction unit 15 may notify, via the user interface 17, that the data is deficient for the prediction of the time, i.e. that the data number m of the estimation data fails to meet a standard for performing the prediction of the time.

When the data number m of the generated estimation data is the necessary data number n or more, the time prediction unit 15 performs the prediction of the time by using the n-number of estimation data. At this time, when the data number m is equal to the necessary data number n, the time prediction unit 15 performs the prediction of the time by using all of the m-number of estimation data. In addition, when the data number m is greater than the necessary data number n, the time prediction unit 15 selects an n-number of estimation data from among the m-number of estimation data, and performs the prediction of the time by using the selected n-number of estimation data. At this time, for example, an n-number of estimation data are selected from the m-number of estimation data in the order from the latest time of estimation. Specifically, an n-number of estimation data $D_{m-n}$ to $D_{m-1}$ are selected from the m-number of estimation data $D_0$ to $D_{m-1}$ in the order from the latest time of estimation, and the prediction of the time is performed by using the selected estimation data $D_{m-n}$ to $D_{m-1}$.

Then, based on the n-number of estimation data, the time prediction unit 15 estimates a time when the internal state of the battery 5 becomes a predetermined state, after the times of estimation for the n-number of estimation data. Accordingly, the time prediction unit 15 estimates the time when the internal state of the battery 5 becomes the predetermined state, based on the internal state of the battery 5 at mutually different times, the estimated time being time after the above-described plural times. Here, the predetermined state is preset, and is set to be a state corresponding to the internal state of the battery 5 at the time when the probability of a sharp decrease of the battery capacitance of the battery 5 increases. In addition, a state in which the deterioration of the internal state of the battery 5 has progressed, compared to the times of estimation for the generated m-number of estimation data, is set to be the predetermined state. For example, a state in which each of the positive electrode capacitance and the negative electrode capacitance of the battery 5 has decreased, compared to the times of estimation for the m-number of estimation data, is set to be the predetermined state.

In the estimation of the time when the internal state of the battery 5 becomes the predetermined state, the time prediction unit 15 sets a predetermined value corresponding to the predetermined state in regard to one or more of the internal state parameters. Then, in regard to the internal state parameter for which the predetermined value is set, the time prediction unit 15 estimates a time when the internal state parameter becomes the predetermined value after the times of estimation for the n-number of estimation data. In one example, a time when the negative electrode capacitance becomes the predetermined value is estimated. In another example, the time when each of the negative electrode capacitance and positive electrode capacitance becomes the predetermined value is estimated. In this case, the predetermined value relating to the negative electrode capacitance and the predetermined value relating to the positive electrode capacitance may be identical values or different values.

Here, when the predetermined value is set for each of the negative electrode capacitance and positive electrode capacitance, a value lower than the values in the generated m-number of estimation data is set as the predetermined value. In addition, when a predetermined value is set for an initial charge amount of each of the positive electrode and negative electrode, two values, i.e. a value lower than the value at the time of start of use of the battery 5 and a value greater than the value at the time of start of use of the battery 5, are set as predetermined values. Further, when a predetermined value is set for the SOW, two values, i.e. a value in a case where the direction of a shift of the initial charge amount of the negative electrode relative to the initial charge amount of the positive electrode becomes identical to the direction at the time of start of use, and a value in a case where the direction of a shift of the initial charge amount of the negative electrode relative to the initial charge amount of the positive electrode becomes opposite to the direction at the time of start of use, are as predetermined values. As regards the internal state parameter for which two predetermined values are set, the time prediction unit 15 estimates a time when the internal state parameter becomes a corresponding one of the two predetermined values, based on the n-number of estimation data.

In estimating the time when a certain internal state parameter becomes the predetermined value, the time prediction unit 15 calculates a function indicative of the relation of the internal state parameter to a time. Here, when a time t and an internal state parameter y are defined, in one example, a linear function expressed by $y=at+b$ is calculated as a function indicative of the relation of the internal state parameter to a time. The time prediction unit 15 calculates the function, based on the n-number of estimation data. Specifically, the function indicative of the relation of the internal state parameter to a time is calculated based on the internal state of the battery plurality of mutually different times.

Here, a value $y_i$ of an internal state parameter y in n-number of estimation data $D_{m-n}$ to $D_{m-1}$ used for the prediction, and a time $t_i$ indicative of the time of estimation for the n-number of estimation data $D_{m-n}$ to $D_{m-1}$, are defined. Symbol "i" is an integer of 1 to n, and a lower number is allocated to estimation data obtained at a later time of estimation among the estimation data $D_{m-n}$ to $D_{m-1}$. Accordingly, is assumed that $(t, y)=(t_1, y_1)$ indicated in the estimation data $D_{m-n}$, and $(t, y)=(t_1, y_1)$ is indicated in the estimation data $D_{m-1}$.

The time prediction unit 15 calculates the function indicative of the relation of the internal state parameter y to time t, based on the value $y_i$ of the internal state parameter y in the estimation data $D_{m-n}$ to $D_{m-1}$ and the time $t_i$ corresponding to the estimation data $D_{m-n}$ to $D_{m-1}$. At this time, the fitting calculation (regression calculation) using the value $y_i$ and the time $t_i$ is executed, and constants in the function indicative of the relation of the internal state parameter y to the time t are calculated by the fitting calculation. In one example, by a least squares method, a gradient "a" and an intercept "b", which are constants of a linear function, are calculated, and a linear function (y=at+b) indicative of the relation of the internal state parameter y to time t is calculated.

Here, it is assumed that the above-described predetermined value, which is set for internal state parameter y, is a predetermined value $y_p$. Upon calculating the function indicative of the relation of the internal state parameter y to time t, the time prediction unit 15 calculates a value $t_p$ of the time t in a case where the internal state parameter y becomes the predetermined value $y_p$ in the calculated function. For example, when the above-described linear function is calculated as the function indicative of the relation of the internal state parameter y to time t, the time prediction unit 15 calculates the above-described value $t_p$ in regard to the time t, as expressed by equation (1). In addition, the time prediction unit 15 estimates the time corresponding to the calculated value $t_p$ as the time when the internal state parameter y becomes the predetermined value $y_p$.

$$t_p = \frac{(y_p - b)}{a} \quad (1)$$

Figure 2:
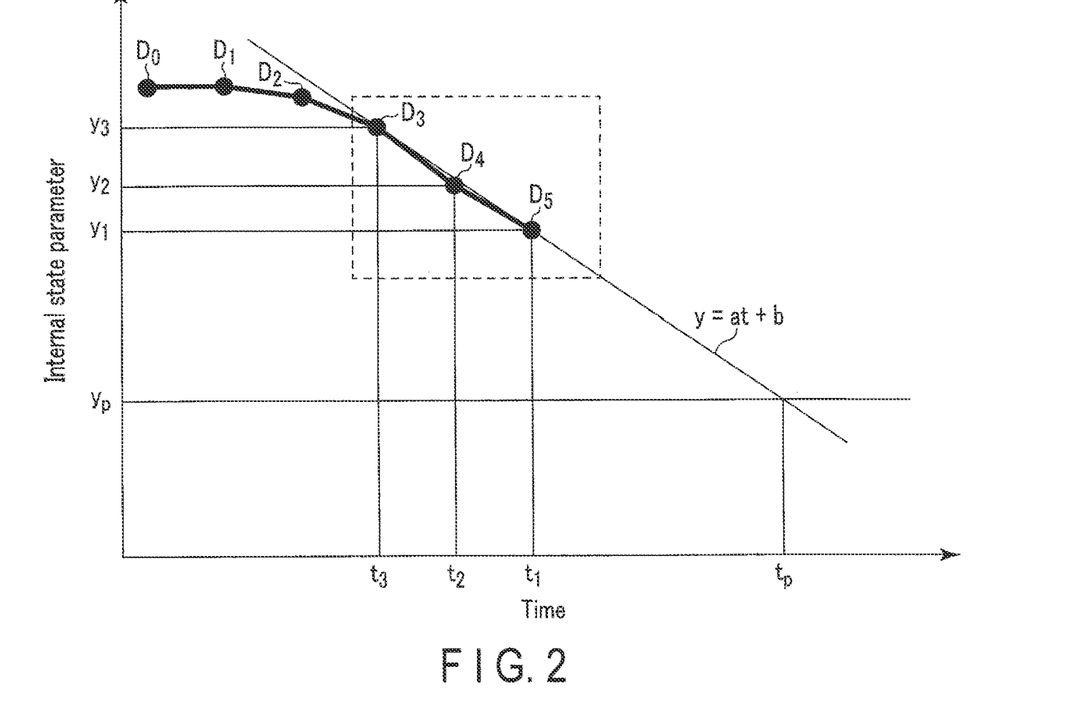
FIG. 2 is a schematic view for explaining a process of estimating a time when a certain internal state parameter becomes a predetermined value, the process being executed by a time prediction unit of a diagnosis device according to the first embodiment.

FIG. 2 is a view for explaining an example of process of estimating a time when a certain internal state parameter y becomes a predetermined value $y_p$, the process being executed by the time prediction unit 15. In the example of FIG. 2, six estimation data are generated, and the data number m of the generated estimation data becomes 6. In addition, the necessary data number n is set at 3. In example of FIG. 2, the time prediction unit 15 calculates the function indicative of the relation of the internal state parameter y to time t, based on values $y_i$ ($y_1$ to $y_3$) of the internal state parameter y in estimation data $D_3$ to $D_5$ (indicated by a broken-line box) and times $t_1$ ($t_1$ to $t_3$) corresponding to the estimation data $D_3$ to $D_5$. At this time, by a least squares method, a linear function (y=at+b) indicative of the relation of the internal state parameter y to time t is calculated. In addition, using the above-described equation (1), the time prediction unit 15 calculates the value $t_p$ of the time t in a case where the internal state parameter y becomes the predetermined value $y_p$ in the calculated linear function.

Further, the time prediction unit 15 estimates the time corresponding to the calculated value $t_p$ as the time when the internal state parameter y becomes the predetermined value $y_p$.

Note that, in one example, in the estimation of the time when a certain internal state parameter y becomes the predetermined value $y_p$, a parameter corresponding to the time t may be used in place of the time t. In this case, the time prediction unit 15 calculates, based on an n-number of estimation data, a function indicative of the relation of the internal state parameter y to the parameter corresponding to the time t. At this time, the function is calculated like the calculation of the function indicative of the relation of the internal state parameter y to the time t. In addition, the time prediction unit 15 calculates the value of the parameter corresponding to the time t in the case where the internal state parameter y becomes the predetermined value $y_p$ in the calculated function. Further, the time corresponding to the value calculated in regard to the parameter corresponding to the time t is estimated as the time when the internal state parameter y becomes the predetermined value $y_p$. Here, examples of the parameter corresponding to the time t include an integration value (time-integration value) of the discharge amount of the battery 5, and an integration value (time-integration value) of the charge amount of the battery 5.

In another example, the time prediction unit 15 calculates a variance in regard to the constants of the above-described function indicative of the relation of the internal state parameter y to the time t or the parameter corresponding to the time t. Further, based on the calculated variance of the constants, in addition to the above-described function, the time prediction unit 15 estimates the time when the internal state parameter y becomes the predetermined value $y_p$. In this case, as the time when the internal state parameter y becomes the predetermined value $y_p$, a time range between a lower-limit value $t_{p1}$ and an upper-limit value $t_{ph}$ is estimated. Accordingly, the time when the internal state parameter y becomes the predetermined value $y_p$ is estimated in a state with a time width. Note that the value $t_p$ of the time t estimated as the time when the internal state parameter y becomes the predetermined value $y_p$ in the above-described example, in which a variance in regard to the constants of the function is not considered, is included in the time range between the lower-limit value $t_{p1}$ and the upper-limit value $t_{ph}$.

For example, when the linear function indicative of the relation of the internal state parameter y to the time t is calculated by the least squares method, the time prediction method 15 calculates a variance in regard to a gradient "a" and an intercept "b", which are constants of a linear function. A variance $v_a$ of the gradient "a" is calculated as indicated by equation (2), and a variance $v_b$ of the intercept "b" is calculated as indicated by equation (3). In equation (2) and equation (3), s is a parameter indicative of a variance in an n-number of estimation data $D_{m-n}$ to $D_{m-1}$ used for the estimation. The parameter s is set to a proper value in accordance with a measurement error in the measurement of the parameters relating to the battery 5, such as the electric current and voltage of the battery 5, and the width of the value, or the like, in the estimation of the internal state of the battery 5. In addition, $t_e$ is an average value of the times $t_1$ ($t_1$ to $t_n$). Then, using the calculated variance, the lower-limit value $t_{p1}$ is calculated as expressed in equation (4) and the upper-limit value $t_{ph}$ is calculated as expressed in equation (5), in regard to the time range that is the time when the internal state parameter y becomes the predetermined value $y_p$.

$$v_a = \frac{s^2}{\sum_{i=1}^{n}(t_i - t_e)^2} \quad (2)$$

$$v_b = \frac{s^2 \sum_{i=1}^{n} t_i^2}{n \sum_{i=1}^{n}(t_i - t_e)^2} \quad (3)$$

$$t_{pi} = \frac{(y_p - (b - v_b^{0.5}))}{a - v_a^{0.5}} \quad (4)$$

$$t_{ph} = \frac{(y_p - (b + v_b^{0.5}))}{a + v_a^{0.5}} \quad (5)$$

The time prediction unit 15 estimates the time when the internal state of the battery 5 becomes the above-described predetermined state, based on the estimation result in regard to the time when the internal state parameter becomes the predetermined value. In one example, in regard to only one internal state parameter, the time when the internal state parameter becomes the predetermined value is estimated. In addition, the time prediction unit 15 determines that the time estimated as the time when the one internal state parameter becomes the predetermined value is the time when the internal state of the battery 5 becomes the predetermined state. In another example, in regard to each of a plurality of internal state parameters, time when the internal state parameter becomes predetermined value is estimated, and a plurality of times are estimated. In addition, the time prediction unit 15 determines that the earliest time among the estimated times is the time when the internal state of the battery 5 becomes the predetermined state. Besides, when the time when the internal state parameter becomes the predetermined value is estimated in regard to each of the plurality of internal state parameters, the time prediction unit 15 may determine that a time corresponding to an average value or an intermediate value of the estimated times is the time when the internal state of the battery 5 becomes the predetermined state.

The time prediction unit 15 predicts that the time corresponding to the estimation result in regard to the time when the internal state of the battery 5 becomes the predetermined state is the time when the probability of a sharp decrease of the battery capacitance of the battery 5 increases. In the present embodiment, the time estimated as the time when the internal state of the battery 5 becomes the predetermined state is decided to be a final prediction result of the time when the probability of a sharp decrease of the battery capacitance of the battery 5 increases. The time prediction unit 15 stores in the data storage unit 16 the prediction result of the time when the probability of a sharp decrease of the battery capacitance of the battery 5 increases. Besides, the time prediction unit 15 may notify the above-described prediction result via the user interface 17.

In the present embodiment, after the data number m of the estimation data generated in regard to the internal state becomes the necessary data number n or more, the time prediction unit 15 predicts the time when the probability of a sharp decrease of the battery capacitance of the battery 5 increases, each time the estimation of the internal state of the battery 5 is executed. In addition, each time the time prediction unit 15 executes the prediction of the time, the time prediction unit 15 updates the time when the probability of a sharp decrease of the battery capacitance of the battery 5 increases, to the latest prediction result. Thereby, in the present embodiment, the time when the internal state of the battery 5 becomes the predetermined state is updated to the latest estimation result.

Figure 3:
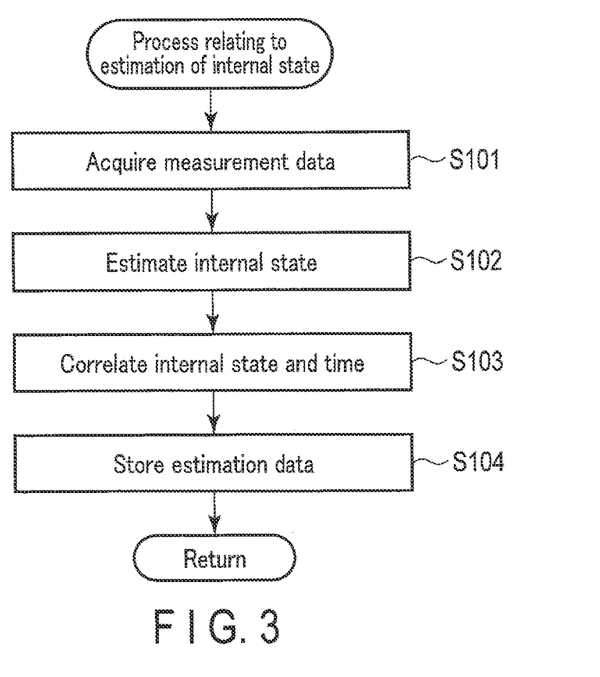
FIG. 3 is a flowchart illustrating an example of a process relating to estimation of an internal state, the process being executed by the diagnosis device according to the first embodiment.

FIG. 3 illustrates an example of a process relating to the estimation of the internal state, the process being executed by the diagnosis device 3. The process illustrated in FIG. 3 is periodically executed after the start of use of the battery 5. In addition, the above-described data number m of the estimation data is incremented by 1, each time the process of FIG. 3 is executed. If the process of FIG. 3 is started, the transmission-reception unit acquires the measurement data including the measurement result of the parameter relating to the battery 5, as described above (S101). Then, based on the measurement data, the internal state estimation unit 12 estimates the internal state of the battery (S102). Subsequently, the internal state estimation unit 12 correlates the estimated internal state with the time (S103). Then, the internal state estimation unit 12 stores in the data storage unit 16 the estimation data in which the estimated internal state is correlated with the time of estimation (S104).

Figure 4:
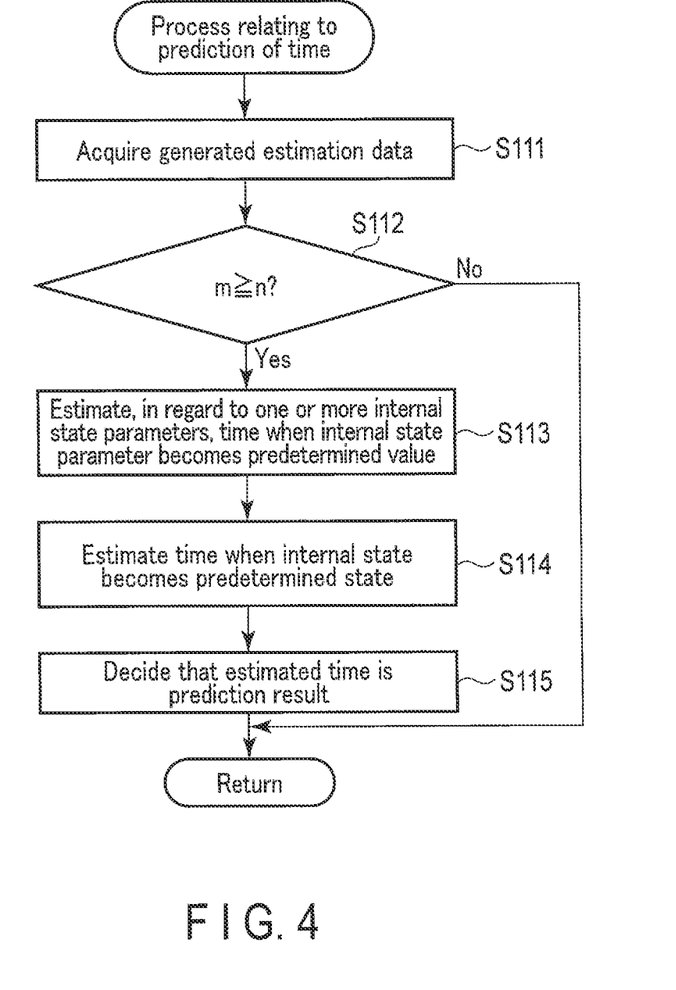
FIG. 4 is a flowchart illustrating an example of a process relating to prediction of a time when the probability of a sharp decrease of the battery capacitance of the battery increases, the process being executed by the diagnosis device according to the first embodiment.

FIG. 4 illustrates an example of a process relating to the prediction of the time when the probability of a sharp decrease of the battery capacitance of the battery 5 increases, the process being executed by the diagnosis device 3. The process of FIG. 4 is executed, for example, each time the process of FIG. 3 is executed, and each time the internal state of the battery 5 is estimated. If the process of FIG. 4 is started, the time prediction unit 15 acquires estimation data estimated in regard to the internal state of the battery 5 (S111). Then, the time prediction unit 15 determines whether or not the data number m of the generated estimation data is the necessary data number n or more (S112). When the data number m is less than the necessary data number n (S112—No), the process of S113 to S115 is skipped, and the prediction of the time is not performed.

On the other hand, when the data number m is the necessary data number n or more (S112—Yes), the time prediction unit 15 performs the prediction of the time, by using an n-number of estimation data among the m-number of estimation data in the order from the latest time of estimation. At this time, in regard to each of one or more of the internal state parameters, the time prediction unit estimates the time when the internal state parameter becomes the above-described predetermined value (S113). In this case, the time when the internal state becomes the predetermined value is estimated to be a time later than the times of estimation for the n-number of estimation data. Then, based on the estimation result in regard to the time when the internal state parameter becomes the predetermined value, the time prediction unit 15 estimates the time when the internal state of the battery 5 becomes the above-described predetermined state (S114). Further, the time prediction unit 15 decides that the time estimated as the time when the internal state becomes the predetermined state is the final prediction result of the time when the probability of a sharp decrease of the battery capacitance of the battery 5 increases (S115).

As described above, in the present embodiment, based on the internal state of the battery 5 at the plurality of times, the time when the internal state of the battery 5 becomes the predetermined state after the plurality of times is estimated. Thus, by setting the predetermined state to be the state corresponding to the internal state of the battery 5 at the time when the probability of a sharp decrease of the battery capacitance increases, the time when the probability of a sharp decrease of the battery capacitance of the battery 5 increases can be predicted in advance.

Additionally, the time when the probability of a sharp decrease of the battery capacitance of the battery 5 increases is one of indices indicative of the degree of deterioration of the battery 5. In batteries such as the battery 5, even when the batteries have mutually similar tendencies of the time variation of the battery capacitance from the time of start of use, there is a case where the batteries have different tendencies of the time variation of the internal state from the time of start of use. In the present embodiment, the index indicative of the degree of deterioration of the battery 5 is predicted based on the internal state of the battery 5 at different times. Since the prediction is performed by taking into account the tendency of the time variation of the internal state, too, the time when the probability of a sharp decrease of the battery capacitance increases can be properly predicted.

Additionally, in the present embodiment, the time when the internal state of the battery 5 becomes the predetermined state is estimated based on the estimation result in regard to the time when the internal state parameter becomes the predetermined value. Thus, the time when the internal state becomes the predetermined state is properly estimated. In addition, in the present embodiment, the function indicative of the relation of the internal state parameter to the time or the parameter corresponding to the time is calculated based on the internal state of the battery at a plurality of times. In addition, the time when the internal state parameter becomes the predetermined value is estimated based on the value of the time or the parameter corresponding to the time in the case where the internal state parameter becomes the predetermined value in the calculated function. Thus, the time when the internal state parameter becomes the predetermined value is properly estimated.

Additionally, in one example, a variance is calculated in regard to the constants of the above-described function indicative of the relation of the internal state parameter to the time or the parameter corresponding to the time. Further, based on the calculated variance of the constants, the time when the internal state parameter becomes the predetermined value is estimated. In this case, the time when the internal state parameter becomes the predetermined value is properly estimated by taking into account the measurement error in the measurement of the parameters relating to the battery 5, the width of the value in the estimation of the internal state of the battery 5, the width of the value in the calculation of the above-described function, and the like.

Figure 5:
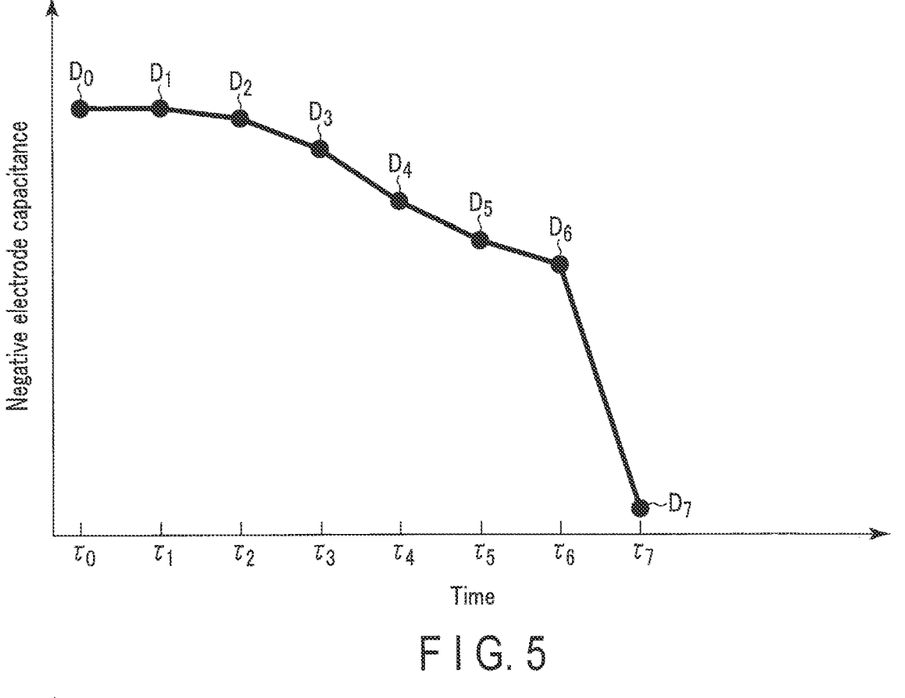
FIG. 5 is a schematic view illustrating an estimation result of a negative electrode capacitance which is one of internal state parameters of the battery, in verification relating to the embodiment.

Note that the following verification was conducted in regard to the estimation of the time, which is performed in the above-described embodiment or the like. In the verification, the estimation of the internal state was periodically performed eight times in regard to a certain one battery, and the internal state of the battery was estimated at each of times $\tau_0$ to $\tau_7$. Thus, estimation data $D_0, D_1, \ldots, D_7$ were generated in the order from the earliest one. FIG. 5 illustrates an estimation result, in the verification, of a negative electrode capacitance which is one of the internal state parameters of the battery. In FIG. 5, the abscissa axis indicates time, and the ordinate axis indicates the negative electrode capacitance. In the verification, the negative electrode capacitance varied as illustrated in FIG. 5, during a period of times $\tau_0$ to $\tau_7$.

In the verification, immediately after the generation of each of the estimation data $D_3$ to $D_6$, the time when the probability of a sharp decrease of the battery capacitance of the battery increases was predicted. Specifically, at each of times $\tau_3$ to $\tau_6$ or immediately after each of times $\tau_3$ to $\tau_6$, the prediction of the time was conducted. In the verification, the necessary data number n was set at 3. Thus, for example, in the prediction conducted at time $\tau_3$ or immediately after $\tau_3$, the estimation data $D_1$ to $D_3$ were used. In the prediction conducted at time $\tau_6$ or immediately after $\tau_6$, the estimation data $D_4$ to $D_6$ were used.

In addition, in the verification, in each prediction of the time, the time when the negative electrode capacitance, which is one of the internal state parameters of the battery, becomes the predetermined value was estimated. At this time, the function indicative of the relation of the negative electrode capacitance to the time was calculated. In the calculation of the function, a linear function (y=at+b) was calculated by a least squares method. Then, the value of the time when the negative electrode capacitance becomes the predetermined value in the linear function was estimated as the time when the negative electrode capacitance becomes the predetermined value. Further, the time estimated as the time when the negative electrode capacitance becomes the predetermined value was set as the time when the internal state of the battery 5 becomes the predetermined state. In addition, the time estimated as the time when the internal state of the battery becomes the predetermined state was set as the final prediction result of the time when the probability of a sharp decrease of the battery capacitance increases.

Figure 6:
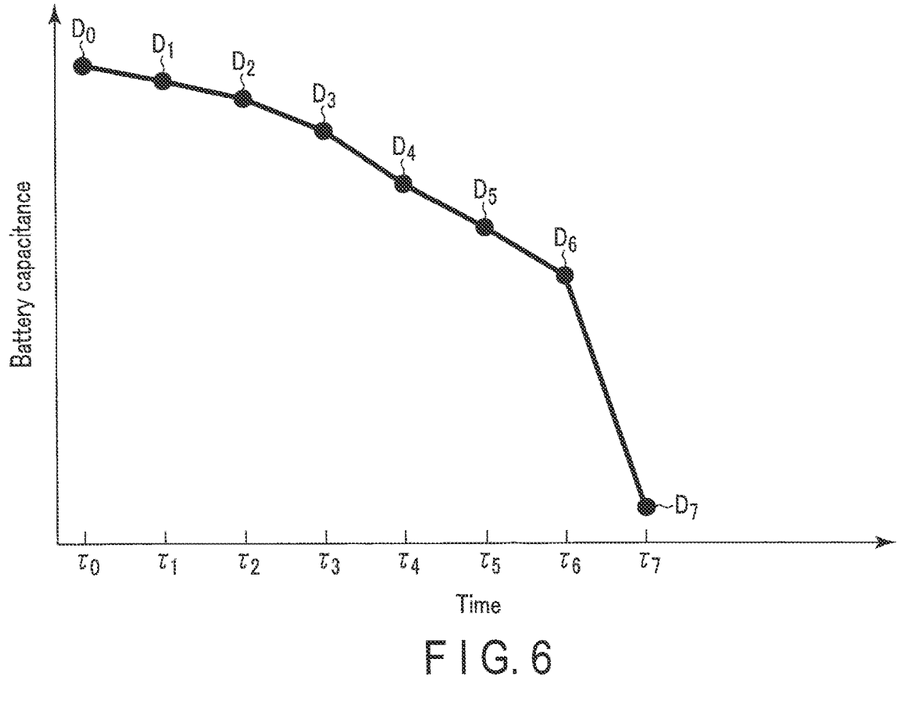
FIG. 6 is a schematic view illustrating a measurement result of the battery capacitance of the battery in the verification relating to the embodiment.

Besides, in the verification, validity was confirmed in regard to the time predicted as described above. Thus, in the verification, the battery capacitance of the battery was measured as a process which is not executed in the above-described embodiment or the like. At this time, the battery capacitance was measured, such as by discharging the battery from the completely charged state (full-charged state) to the completely discharged state. FIG. 6 illustrates the measurement result of the battery capacitance in the verification. In FIG. 6, the abscissa axis indicates time, and the ordinate axis indicates the battery capacitance. In the verification, the battery capacitance varied during a period of times $\tau_0$ to $\tau_7$, as illustrated in FIG. 6. As illustrated in FIG. 6, in the verification, the battery capacitance sharply decreased with time between time $\tau_6$ and time $\tau_7$.

Figure 7:
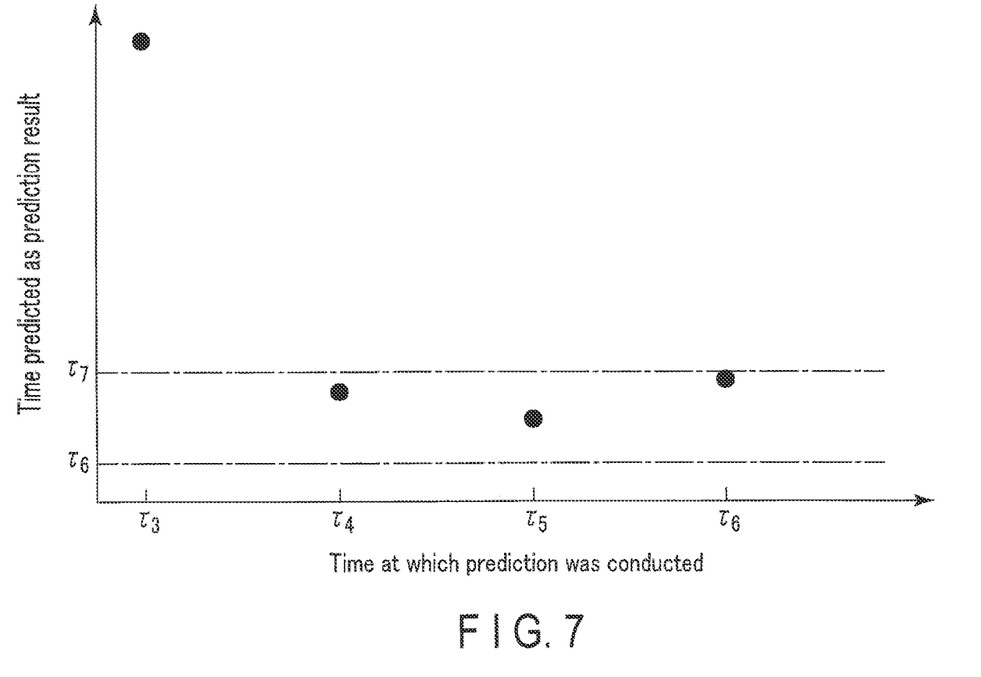
FIG. 7 is a schematic view illustrating a prediction result relating to a time when the probability of a sharp decrease of the battery capacitance of the battery increases, in the verification relating to the embodiment.

FIG. 7 illustrates a prediction result in the verification in regard to the time when the probability of a sharp decrease of the battery capacitance of the battery increases. In FIG. 7, the abscissa axis indicates the time at which prediction was conducted, and the ordinate axis cates the time predicted as a prediction result. As illustrated in FIG. 7, in the verification, in the prediction conducted at each of times $\tau_4$ to $\tau_6$, values between times $\tau_6$ and $\tau_7$ were predicted as prediction results. Thus, in the prediction conducted at time $\tau_4$ or immediately after times $\tau_4$, proper prediction results corresponding to the actual variation of the battery capacitance were predicted in regard to the time when the probability of a sharp decrease of the battery capacitance of the battery increases. Accordingly, it was verified that the time when the probability of a sharp decrease of the battery capacitance of the battery increases is properly predicted in advance, by predicting the time in the same manner as in the embodiment or the like. In short, the validity was confirmed in regard to the prediction of the time in the embodiment or the like.

Second Embodiment

Next, a second embodiment will be described. Note that, in the description below, a description of the same parts as in the first embodiment or the like is omitted. In the present embodiment, too, the time prediction unit 15 predicts the time when the probability of a sharp decrease of the battery capacitance of the battery increases, in the same manner as in the above embodiment or the like.

However, in the present embodiment, after conducting the prediction of the time, the time prediction unit 15 executes, through the user interface 17, either an alert or an inspection request for the battery 5, before the time predicted as the time when the probability of a sharp decrease of the battery capacitance of the battery increases. In one example, the time prediction unit 15 acquires an arrival time from the present time point until the time predicted as the prediction result. Then, when the arrival time is a threshold time or less, the time prediction unit 15 executes either an alert or an inspection request for the battery 5.

Figure 8:
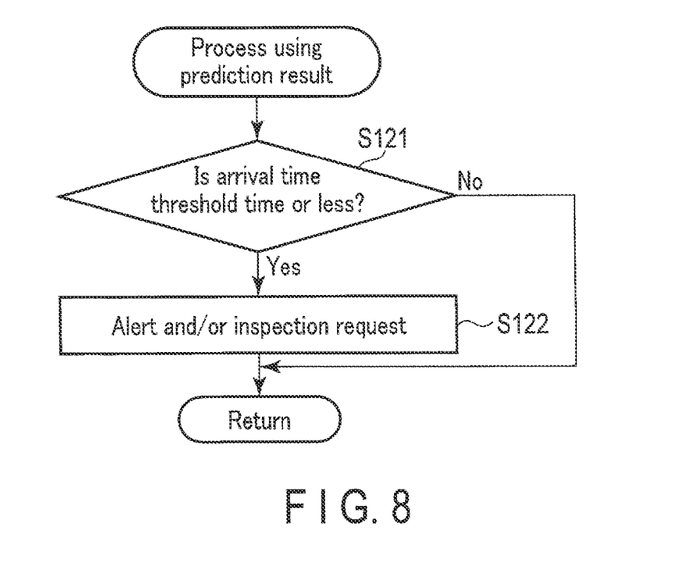
FIG. 8 is a flowchart illustrating an example of a process using the prediction result in regard to the time when the probability of a sharp decrease of the battery capacitance of the battery increases, the process being executed by a diagnosis device according to a second embodiment.

FIG. 8 illustrates an example of a process using the prediction result in regard to the time when the probability of a sharp decrease of the battery capacitance of the battery 5 increases, the process being executed by the diagnosis device 3. The process of FIG. 8 is periodically executed after the above-described prediction of the time. If the process of FIG. 8 is started, the time prediction unit 15 determines whether or not the arrival time from the present time point until the time predicted as the prediction result is the threshold time or less (S121). When the arrival time is the threshold time or less (S121—Yes), the time prediction unit 15 executes either an alert or an inspection request for the battery 5 (S122). On the other hand, when the arrival time is greater than the threshold time (S121—No), the process of S122 is skipped. In the present embodiment, the user or the like of the battery-mounted device 2 can easily understand that the time when the probability of a sharp decrease of the battery capacitance of the battery 5 increases is drawing near.

Third Embodiment

Next, a third embodiment will be described. Note that, in the description below, a description of the same parts as in the first embodiment or the like is omitted. In the present embodiment, too, the time prediction unit 15 predicts the time when the internal state of the battery 5 becomes the predetermined state, in the same manner as in the above embodiment or the like.

However, in the present embodiment, the time prediction unit 15 acquires a use history of the battery 5 until the time of generation of the estimation data $D_{m-1}$, which is latest in regard to the time of estimation among the n-number of estimation data $D_{m-n}$ to $D_{m-1}$ used for the prediction of the time. Specifically, the use history of the battery 5 until the m-th estimation of the internal state from the start of use of the battery 5 is acquired by the time prediction unit 15. Then, based on the acquired history of the battery 5, the time prediction unit 15 determines whether or not to correct the estimation result in regard to the time when the internal state becomes the predetermined state.

Specifically, in the present embodiment, like the above-described embodiment or the like, based on the internal state of the battery 5 at a plurality of mutually different times, the time when the internal state of the battery 5 becomes a predetermined state after the plurality of times is estimated. In the present embodiment, however, whether or not to correct the estimation result in regard to the time when the internal state of the battery 5 becomes the predetermined state is determined based on the use history of the battery 5 until the latest time among the plural times.

In the present embodiment, the time prediction unit 15 compares the use state of the battery 5 at or after the time of generation of the estimation data $D_{m-2}$, which second latest in regard to the time of estimation among the estimation data $D_{m-n}$ to $D_{m-1}$, with the use state of the battery 5 before the time of generation of the estimation data $D_{m-2}$. Specifically, the use state of the battery 5 until the m-th estimation of the internal state from the (m-1)th estimation of the internal state is compared with the use state of the battery 5 before the (m-1)th estimation. Then, the time estimation unit 15 determines whether the variation of the use state of the battery 5 is within a reference range between a time before the (m-1)th estimation of the internal state and a time at or after the (m-1)th estimation of the internal state.

In the present embodiment, too, the time prediction unit 15 predicts that the time corresponding to the estimation result in regard to the time when the internal state of the battery 5 becomes the predetermined state is the time when the probability of a sharp decrease of the battery capacitance of the battery 5 increases. However, in this embodiment, only when the above-described variation of the use state of the battery 5 is within the reference range, does the time estimation unit 15 decide that the time estimated as the time when the internal state of the battery 5 becomes the predetermined state is the final prediction result of the time when the probability of a sharp decrease of the battery capacitance of the battery 5 increases. In addition, when the variation of the use state of the battery 5 exceeds the reference range, the time prediction unit 15 corrects the time estimated as the time when the internal state becomes the predetermined state, in accordance with the variation of the use state. Further, the time prediction unit 15 decides that the time corrected in accordance with the variation of the use state is the final prediction result of the time when the probability of a sharp decrease of the battery capacitance of the battery 5 increases.

In one example, in the comparison of the use state of the battery 5, one or more of items relating to the use state of the battery 5 are set. In addition, the time prediction unit 15 compares the set one or more items between a time before the (m-1)th estimation of the internal state and a time at or after the (m-1)th estimation of the internal state. As the item relating to the use state of the battery 5, use may be made of either an average current value and a maximum current value in the charge of the battery 5, or an integration value (time-integration value) of the charge amount of the battery 5, and use may be made of either an average current value and a maximum current value in the discharge of the battery 5, or an integration value (time-integration value) of the discharge amount of the battery 5. Further, as the item for the comparison, use may be made of any one of an average temperature, a maximum temperature and a minimum temperature of the battery 5, or use may be made of a time during which the charge or discharge is stopped in the battery 5.

In the use of the battery 5, for example, there is a case where one or more of the set items vary greatly between a time at or after the (m-1)th estimation of the internal state and a time before the (m-1)th estimation of the internal state. In this case, the time prediction unit 15 determines that the variation of the use state of the battery 5 exceeds the reference range. Then, the time prediction unit 15 corrects the time estimated as the time when the internal state becomes the predetermined state, in accordance with the variation of the use state.

In one example, the average temperature of the battery 5 is set as the above-described item for comparison. Here, it is assumed that at or after the (m-1)th estimation of the internal state, the average temperature of the battery 5 was higher by about 10° C. than before the (m-1)th estimation of the internal state. In this case, the time prediction unit 15 determines that the battery 5 was used in a high-temperature environment only during the period from the (m-1)th estimation of the internal state to the m-th estimation of the internal state. In addition, the time prediction unit 15 executes determination by assuming that at or after the m-th estimation of the internal state, the battery 5 is used in the same temperature environment as before the (m-1)th estimation of the internal state. Further, the time prediction unit 15 corrects, based on an empirical rule or the like, the time estimated as the time when the internal state becomes the predetermined state. Thereby, a time that is the final prediction result becomes later than the time estimated as the time when the internal state becomes the predetermined state.

Figure 9:
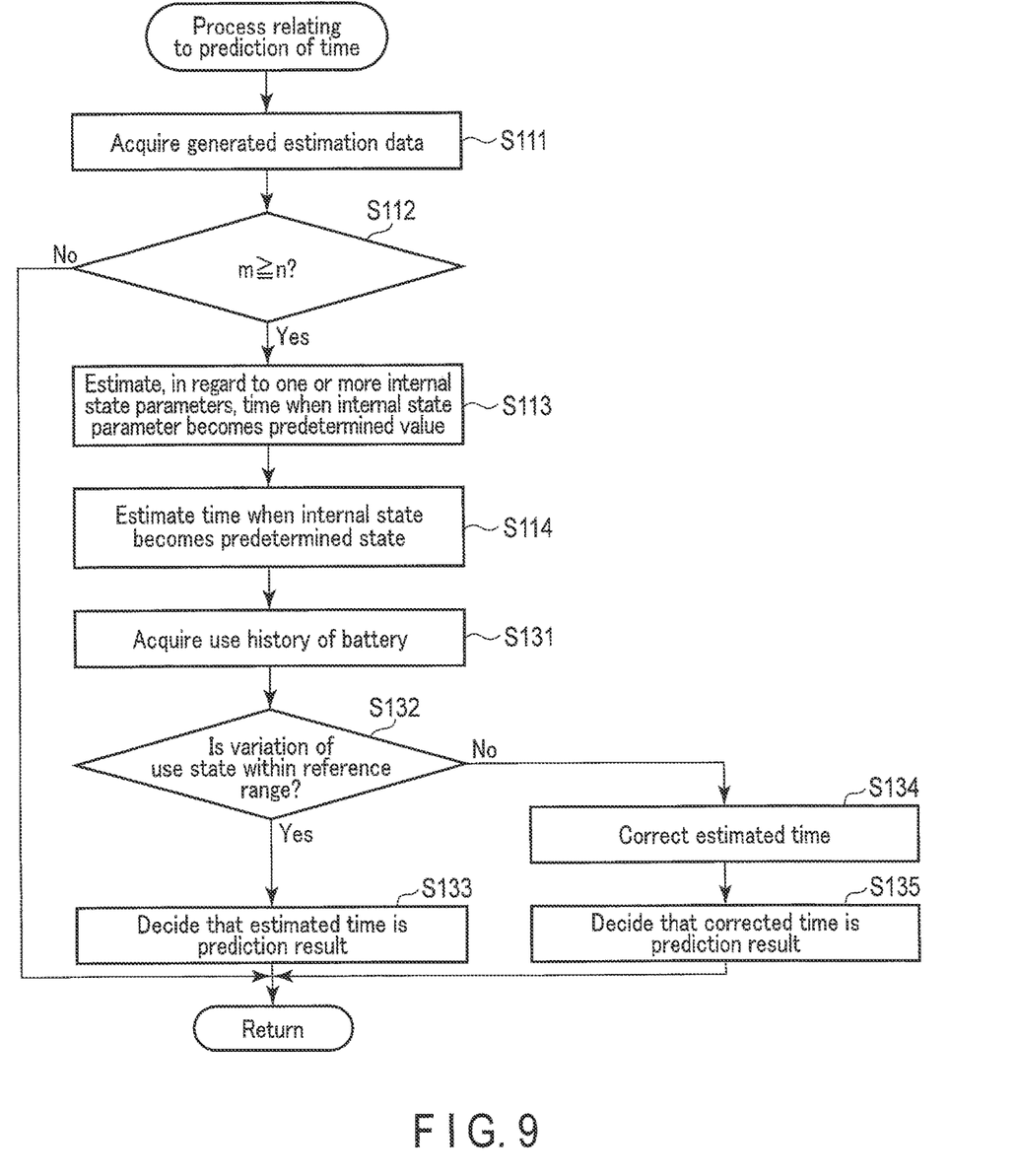
FIG. 9 is a flowchart illustrating an example of a process relating to prediction of a time when the probability of a sharp decrease of the battery capacitance of the battery increases, the process being executed by a diagnosis device according to a third embodiment.

FIG. 9 illustrates an example of a process relating to the prediction of the time when the probability of a sharp decrease of the battery capacitance of the battery 5 increases, the process being executed by the diagnosis device 3 of the present embodiment. If the process of FIG. 9 is started, like the process of FIG. 4, the time prediction unit 15 executes the process of S111 and S112. Then, when the data number m is the necessary data number n or more (S112—Yes), the time prediction unit 15 executes the process of S113 and S114. However, in the present embodiment, upon estimating the time when the internal state of the battery 5 becomes the predetermined state, the time prediction unit 15 acquires the use history of the battery 5 until the m-th estimation of the internal state from the start of use of the battery 5 (S131). Then, the time estimation unit 15 determines whether the variation of the use state of the battery 5 is within the reference range between a time before the (m-1)th estimation of the internal state and a time at or after the (m-1)th estimation of the internal state (S132).

When the variation of the use state of the battery 5 is within the reference range (S132—Yes), the time estimation unit 15 decides that the time estimated as the time when the internal state of the battery 5 becomes the predetermined state is the final prediction result of the time when the probability of a sharp decrease of the battery capacitance of the battery 5 increases (S133). On the other hand, when the variation of the use state of the battery 5 exceeds the reference range (S132—No), the time prediction unit 15 corrects the time estimated as the time when the internal state becomes the predetermined state, in accordance with the variation of the use state (S134). Further, the time prediction unit 15 decides that the corrected time is the final prediction result of the time when the probability of a sharp decrease of the battery capacitance of the battery 5 increases (S135). In the present embodiment, the prediction result corresponding to the use history of the battery 5 is properly predicted in regard to the time when the probability of a sharp decrease of the battery capacitance of the battery 5 increases.

In at least one of the above-described embodiments or examples, based on an internal state of a battery at a plurality of mutually different times, a time when the internal state of the battery becomes a predetermined state after the plurality of times is estimated. Thereby, there are provided a diagnosis method of a battery, a diagnosis device of a battery, diagnosis system of a battery, a battery-mounted device, and a non-transitory storage medium which can predict in advance a time when the probability of a sharp decrease of the battery capacitance of the battery increases.

While certain embodiments have been described, these oddments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A diagnosis method of a battery, comprising:
   estimating, by an internal state estimation unit, an internal state of the battery, by using a measurement result relating to at least one of a voltage and an electric current of the battery and a relation of the internal state of the battery to at least one of the voltage and the electric current of the battery, in regard to each of a plurality of mutually different times;
   setting, by a time prediction unit, a predetermined value, which is a value corresponding to a time when a probability of a sharp decrease of a battery capacitance of the battery increases, in regard to one or more of internal state parameters, the internal state parameters being indicative of the internal state of the battery; and
   outputting a time when the internal state parameter becomes the predetermined value after the plurality of mutually different times as the time when the probability of the sharp decrease of the battery capacitance of the battery increases, the time when the internal state parameter becomes the predetermined value after the plurality of mutually different times being estimated by the time prediction unit based on the estimated internal state of the battery in each of the plurality of mutually different times.

2. The diagnosis method of claim 1, wherein in setting the predetermined value:
   the time when the internal state parameter becomes the predetermined value after the plurality of times is estimated in regard to each internal state parameter, and
   the time when the probability of the sharp decrease of the battery capacitance of the battery increases is estimated based on an estimation result in regard to the time when the internal state parameter becomes the predetermined value.

3. The diagnosis method of claim 2, wherein
   in the estimating of the time when the probability of the sharp decrease of the battery capacitance of the battery increases:
   a function indicative of a relation of the internal state parameter to a time or a parameter relating to the time is calculated based on the internal state of the battery at the plurality of times, and
   the time when the internal state parameter becomes the predetermined value is estimated based on a value of the time or the parameter corresponding to the time in a case where the internal state parameter becomes the predetermined value in the calculated function.

4. The diagnosis method of claim 3, wherein
   in the estimating of the time when the probability of the sharp decrease of the battery capacitance of the battery increases:
   a variance is calculated in regard to a constant of the function indicative of the relation of the internal state parameter to the time or the parameter corresponding to the time, and the time when the internal state parameter becomes the predetermined value is estimated based on the calculated variance of the constant.

5. The diagnosis method of claim 1, further comprising:
determining whether or not to correct an estimation result in regard to the time when the probability of the sharp decrease of the battery capacitance of the battery increases, based on a use history of the battery until a latest time among the plurality of times.

6. The diagnosis method of claim 1, further comprising:
executing either an alert or an inspection request for the battery, before a time predicted as the time when the probability of the sharp decrease of the battery capacitance of the battery increases.

7. A diagnosis device of a battery, comprising:
a processor configured to:
  estimate, by an internal state estimation unit, an internal state of the battery, by using a measurement result relating to at least one of a voltage and an electric current of the battery and a relation of the internal state of the battery to at least one of the voltage and the electric current of the battery, in regard to each of a plurality of mutually different times;
  set, by a time prediction unit, a predetermined value, which is a value corresponding to a time when a probability of a sharp decrease of a battery capacitance of the battery increases, in regard to one or more of internal state parameters, the internal state parameters being indicative of the internal state of the battery; and
  output a time when the internal state parameter becomes the predetermined value after the plurality of mutually different times as the time when the probability of the sharp decrease of the battery capacitance of the battery increases, the time when the internal state parameter becomes the predetermined value after the plurality of mutually different times being estimated by the time prediction unit based on the estimated internal state of the battery in each of the plurality of mutually different times.

8. A diagnosis system of a battery, comprising:
the diagnosis device of claim 7; and
the battery diagnosed by the diagnosis device.

9. The diagnosis system of claim 8, further comprising:
a battery-mounted device in which the battery is mounted.

10. A battery-mounted device comprising:
the diagnosis device of claim 7; and
the battery diagnosed by the diagnosis device.

11. A non-transitory storage medium storing a diagnosis program of a battery, the diagnosis program causing a computer to implement:
  estimating, by an internal state estimation unit, an internal state of the battery, by using a measurement result relating to at least one of a voltage and an electric current of the battery and a relation of the internal state of the battery to at least one of the voltage and the electric current of the battery, in regard to each of a plurality of mutually different times;
  setting, by a time prediction unit, predetermined value, which is a value corresponding to a time when a probability of a sharp decrease of a battery capacitance of the battery increases, in regard to one or more of internal state parameters, the internal state parameters being indicative of the internal state of the battery; and
  outputting a time when the internal state parameter becomes the predetermined value after the plurality of mutually different times as the time when the probability of the sharp decrease of the battery capacitance of the battery increases, the time when the internal state parameter becomes the predetermined value after the plurality of mutually different times being estimated by the time prediction unit based on the estimated internal state of the battery in each of the plurality of mutually different times.

* * * * *